United States Patent
Matsubara (10) Patent No.: US 8,441,832 B2
(45) Date of Patent: May 14, 2013

(54) SEMICONDUCTOR DEVICE AND TEST METHOD THEREOF

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 89 days.

(21) Appl. No.: 13/137,149

(22) Filed: Jul. 22, 2011

(65) Prior Publication Data

US 2011/0280090 A1    Nov. 17, 2011

(30) Foreign Application Priority Data

May 8, 2010   (JP) .................................. 2010-176417

(51) Int. Cl.
  *G11C 5/06*    (2006.01)
(52) U.S. Cl.
  USPC .............. 365/63; 365/193; 365/201; 365/220
(58) Field of Classification Search .................... 365/63, 365/193, 201, 220
  See application file for complete search history.

(56) References Cited

U.S. PATENT DOCUMENTS

| | | | |
|---|---|---|---|
| 6,629,224 B1* | 9/2003 | Suzuki et al. | 711/167 |
| 6,762,617 B2* | 7/2004 | Iwase et al. | 326/11 |
| 7,567,073 B2* | 7/2009 | Hori | 324/76.54 |
| 2003/0099143 A1 | 5/2003 | Fujioka et al. | |

FOREIGN PATENT DOCUMENTS

JP    2003-168299 A    6/2003

* cited by examiner

*Primary Examiner* — Son Dinh
(74) *Attorney, Agent, or Firm* — McGinn IP Law Group, PLLC (57) ABSTRACT

For example, to include plural data input/output terminals and a strobe terminal that are electrically connected in common by a test probe, a command address terminal that is connected to a test probe, and an output control circuit that performs a selecting operation of data output circuits based on a signal that is supplied to the command address terminal. According to the present invention, it is possible to perform a test that uses non-compressed actual data while allocating plural data input/output terminals to one determination circuit within a tester. With this configuration, it is possible to test a large number of semiconductor devices in parallel by using a limited number of determination circuits within the tester.

19 Claims, 9 Drawing Sheets

SEMICONDUCTOR DEVICE AND TEST METHOD THEREOF

BACKGROUND OF THE INVENTION

1. Field of the Invention

The present invention relates to a semiconductor device and a test method thereof, and more particularly relates to a semiconductor device capable of performing an operation test of inputting and outputting actual plural pieces of test data at a high speed, instead of compressed data that is a result of compressing plural pieces of test data, and to a test method of the semiconductor device.

2. Description of Related Art

In a manufacturing process of semiconductor devices such as DRAM (Dynamic Random Access Memory), an operation test is performed. The operation test checks whether manufactured semiconductor devices correctly operate. For example, in a DRAM, a defective cell is detected by an operation test that is performed in a wafer state. An address of the defective cell is relieved by replacing the defective cell with an auxiliary redundant cell.

Such an operation test is performed in parallel on many semiconductor devices (many chips) that are formed on a wafer, to shorten a test time. To further shorten the test time, the number of semiconductor devices to be tested in parallel needs to be increased. Therefore, it is a common procedure to perform a so-called "compression test", in order to test many semiconductor devices in parallel by using a limited number of determination circuits (comparators) within a tester that tests semiconductor devices (see Japanese Patent Application Laid-open No. 2003-168299).

The compression test is not a method of directly inputting and outputting actual test data, but is a method of compressing plural pieces of test data by a data compressing circuit provided within a semiconductor device and inputting and outputting compressed data of the test data via a part of data input/output terminals. When the compression test is used, the number of determination circuits of a tester to be allocated to the semiconductor devices becomes considerably small. In this manner, the number of semiconductor devices that can be tested in parallel can be increased.

However, because compressed data is used in a compression test, the result of the compression test does not necessarily completely match that of a test using non-compressed actual data. For example, the accuracy of plural data input/output terminals and the accuracy of a part of data input/output terminals and a part of data input/output circuits among data input/output circuits respectively related to the plural data input/output terminals are verified by the compression test. However, the accuracy of remaining data input/output terminals and the accuracy of remaining data input/output circuits are not verified by the compression test. A test that uses non-compressed actual data can be performed after semiconductor devices are singulated into individual semiconductor devices by dicing a wafer. When shipping semiconductor devices in a wafer state, for example, it is desired to perform a test that uses actual data in a wafer state as well.

SUMMARY

In one embodiment, there is provided a semiconductor device comprising: a plurality of data input/output terminals each of which is used to output read data to outside and input write data from outside; a plurality of data output circuits each of which outputs the read data to an associated one of the data input/output terminals; a plurality of data input circuits each of which takes in the write data supplied from an associated one of the data input/output terminals synchronously with a strobe signal; a strobe terminal to which the strobe signal is supplied from outside; a signal input terminal to which a signal is supplied from outside, the signal input terminal being different from the data input/output terminals, the strobe terminal, and a terminal that controls the data input/output terminals; and a control circuit having a first operation mode and a second operation mode, wherein in the first operation mode, the control circuit activates all the data output circuits to output the read data in parallel to the data input/output terminals or the control circuit activates all the data input circuits to take in the write data supplied in parallel from the data input/output terminals synchronously with the strobe signal, and in the second operation mode, the control circuit selectively activates one of the data output circuits based on the signal supplied to the signal input terminal to output the read data to an associated one of the data input/output terminals and inactivates the other of the data output circuits, or the control circuit activates all the data input circuits to take in the write data supplied in parallel from the data input data input/output terminals synchronously with the signal supplied to the signal input terminal instead of the strobe signal.

In another embodiment, there is provided a test method of a semiconductor device using a tester, the method comprising: electrically connecting a plurality of first test probes of the tester that are electrically connected in common, respectively to a plurality of data input/output terminals and a strobe terminal of the semiconductor device, the strobe terminal inputting and outputting a strobe signal for defining output timing of read data from the data input/output terminals and defining input timing of write data into the data input/output terminals; electrically connecting at least one second test probe of the tester to at least one signal, input terminal of the semiconductor device that is not related to control of the data input/output terminals; supplying at least one signal to the at least one signal input terminal via the at least one second test probe; selectively outputting the read data from one of the data input/output terminals based on the at least one signal and not outputting the read data from remaining ones of the data input/output terminals in a test mode and in a read mode; taking in the write data that is supplied in common to the data input/output terminals, synchronously with the at least one signal without using the strobe terminal in the test mode and in the write mode; receiving the read data from the first test probes in the read mode; and supplying the write data in common to the data input/output terminals in the write mode.

In still another embodiment, there is provided a test method of a semiconductor device using a tester, the method comprising: electrically connecting a plurality of first test probes of the tester that are electrically connected in common, respectively to a plurality of data input/output terminals of the semiconductor device; electrically connecting at least one second test probe of the tester to at least one signal input terminal of the semiconductor device that is not related to control of the data input/output terminals; supplying at least one selection signal to the at least one signal input terminal via the at least one second test probe; selecting one of a plurality of data output circuits each connected to an associated one of the data input/output terminals based on the at least one selection signal so as to be able to output read data therefrom, and not selecting remaining ones of the data output circuits; and receiving the read data output from selected one of the data output circuits via an associated one of the data input/output terminals and via an associated one of the first test probes.

According to the present invention, it becomes possible to perform a test that uses non-compressed actual data while allocating plural data input/output terminals to one determination circuit within a tester. With this configuration, a large number of semiconductor devices can be tested in parallel by using a limited number of determination circuits within the tester.

BRIEF DESCRIPTION OF THE DRAWINGS

The above features and advantages of the present invention will be more apparent from the following description of certain preferred embodiments taken in conjunction with the accompanying drawings, in which:

FIGS. 2A and 2B are diagrams for explaining connection configurations of a semiconductor device according to the present invention, wherein FIG. 2A shows a connection configuration in a first operation mode and FIG. 2B shows a connection configuration in a second operation mode;

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the present invention has a technical concept of, at a test time, reading actual data without generating data collision (bus fight of test data), by setting any one of plural data input/output terminals that are connected in common outside a semiconductor device to a low impedance state and by setting all remaining data input/output terminals to a high impedance state within the semiconductor device. Therefore, when data input/output terminals to be set to a low impedance state are tested by switching by signal input terminals that are different from the plural data input/output terminals that are connected in common outside the semiconductor device and, actual data output from all data input/output terminals can be tested. Further, the present invention has another technical concept of, at a test time, writing write data from plural data input/output terminals that are connected in common outside a semiconductor device into respectively corresponding plural memory cells via corresponding plural input/output circuits. Therefore, when write data are taken in by signal input terminals that are different from the plural data input/output terminals that are connected in common outside the semiconductor device, actual data supplied from all data input/output terminals can be tested.

Figure 1:
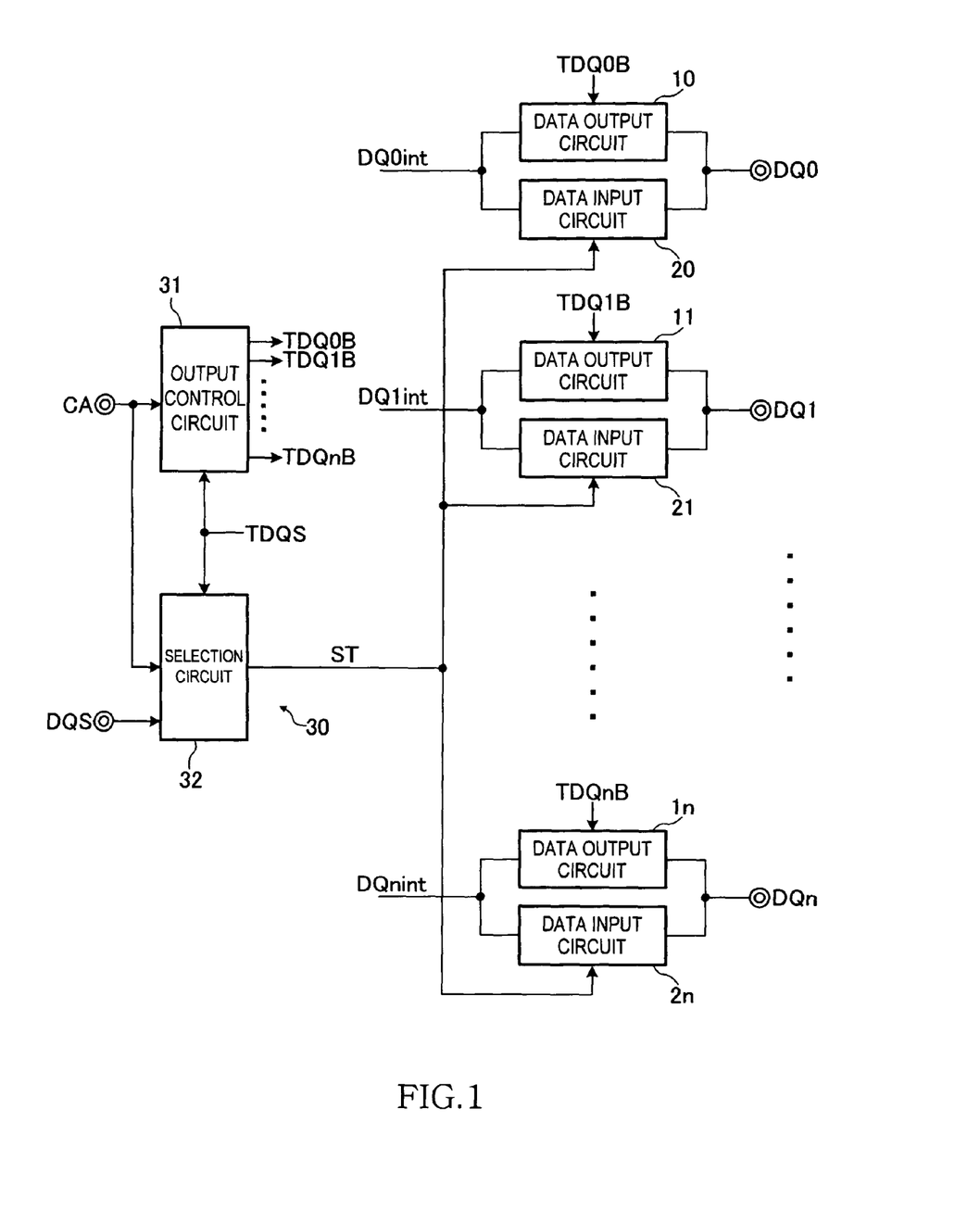
FIG. 1 is a block diagram for explaining a principle of the present invention.

FIG. 1 is a block diagram for explaining the principle of the present invention.

As shown in FIG. 1, a semiconductor device according the present invention has plural data input/output terminals DQ0 to DQn each of which performs an output of read data and an input of write data. Each of the plural data input/output terminals DQ0 to DQn is an external terminal included in the semiconductor device. The data input/output terminals DQ0 to DQn are connected with plural data output circuits 10 to 1n that output respectively corresponding read data, and plural data input circuits 20 to 2n that take in respectively corresponding write data synchronously with a strobe signal ST. A data output circuit 1i and a data input circuit 2i that are connected to the same data input/output terminal DQi (i=0 to n) constitute an I/O circuit according to the present invention. Therefore, the semiconductor device includes plural I/O circuits.

Furthermore, the semiconductor device according to the present invention includes a strobe terminal DQS to which the strobe signal ST is supplied, a signal input terminal CA that is different from the data input/output terminals DQ0 to DQn and the strobe terminal DQS, and a control circuit 30 that is connected to the strobe terminal DQS and the signal input terminal CA. The strobe terminal DQS and the signal input terminal CA are external terminals included in the semiconductor device. The signal input terminal CA is also different from a terminal that controls plural data input/output terminals represented by a known data mask terminal DQM.

A test signal TDQS is supplied to the control circuit 30, and the control circuit 30 operates in either a first operation mode or a second operation mode, based on the supplied test signal. The control circuit 30 includes an output control circuit 31 that controls one of the plural data output circuits 10 to 1n to be active and controls remaining data output circuits to be inactive by the signal input terminal CA during a read operation, and a selection circuit 32 that controls the plural data input circuits 20 to 2n by a signal supplied from either one of the strobe terminal DQS and the signal input terminal CA during a write operation. The output control circuit 31 supplies plural impedance control signals TDQ0B to TDQnB respectively corresponding to the plural data output circuits 10 to 1n. On the other hand, the selection circuit 32 supplies the strobe signal ST in common to the plural data input circuits 20 to 2n.

Figure 2A:
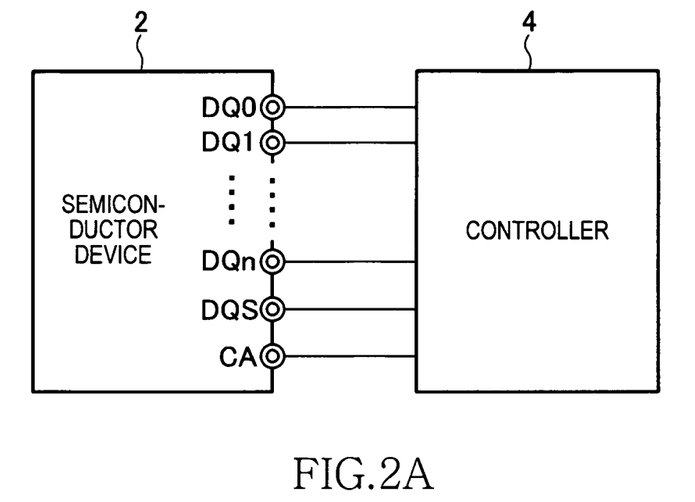
Figure 2B:
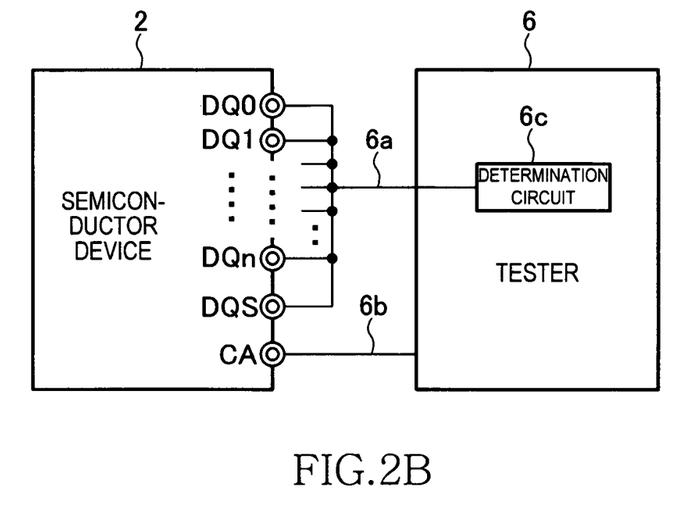

The first operation mode is a normal operation mode, that is, an operation mode that is selected when a user actually uses, and the second operation mode is a test mode that a vendor uses. In the first operation mode, as shown in FIG. 2A, a semiconductor device 2 is connected to a controller 4, and external terminals provided in the semiconductor device 2 are individually connected respectively to external terminals provided in the controller 4. On the other hand, in the second operation mode, as shown in FIG. 2B, the semiconductor device 2 is connected to a tester 6, and the plural data input/output terminals DQ0 to DQn and the strobe terminal DQS, out of the plural external terminals provided in the semiconductor device 2, are electrically connected in common by a probe 6a provided in the tester 6. Meanwhile, the signal input terminal CA is connected to a different probe 6b provided in the tester 6. As shown in FIG. 2B, the probe 6a is connected to one determination circuit 6c within the tester 6. This means that the plural data input/output terminals DQ0 to DQn and the strobe terminal DQS are allocated to the determination circuit 6c, and a test can be performed by the one determination circuit by using actual test data input to and output from the plural terminals.

When the first operation mode is being selected, during a read operation in this mode, the plural impedance control signals TDQ0B to TDQnB as the outputs of the output control circuit 31 are all simultaneously activated. Accordingly, outputs of the data output circuits 10 to 1n are simultaneously activated to a low impedance state, and plural pieces of read data are output in parallel from the data input/output terminals DQ0 to DQn.

When the first operation mode is being selected, during a write operation in this mode, the selection circuit 32 selects the strobe terminal DQS, and supplies a first external signal that is supplied from the tester 6 to the strobe terminal DQS, as the strobe signal ST, to the data input circuits 20 to 2n. Accordingly, plural pieces of write data supplied in parallel to the data input/output terminals DQ0 to DQn are taken into corresponding plural data input circuits 20 to 2n synchronously with the strobe signal ST that is related to the first external signal.

When the second operation mode is being selected, during a read operation in this mode, any one of the plural impedance control signals TDQ0B to TDQnB as the outputs of the output circuit 31 is activated based on a signal that is supplied to the signal input terminal CA. Accordingly, any one of the plural data output circuits 10 to 1n is activated to a low impedance sate, and remaining all data output circuits are inactivated to a high impedance state. Therefore, read data of a corresponding data output circuit is output from any one of the plural data input/output terminals DQ0 to DQn. As explained with reference to FIG. 2B, in the second operation mode, the data input/output terminals DQ0 to DQn are electrically connected in common by the probe 6a. However, in the present invention, because it can be arranged such that only an output of one of the data output circuits 10 to 1n is set to a low impedance state, data collision is not generated. By changing information of a signal to be supplied to the signal input terminal CA, corresponding plural pieces of read data can be read out from the plural data input/output terminals DQ0 to DQn.

Further, when the second operation mode is being selected, during a write operation in this mode, the selection circuit 32 selects the signal input terminal CA, and supplies a second external signal that is supplied from the tester 6 to the signal input terminal CA via the probe 6b, as the strobe signal ST, to the data input circuits 20 to 2n. Accordingly, one write data supplied in parallel to the data input/output terminals DQ0 to DQn is taken in common into the plural data input circuits 20 to 2n synchronously with the strobe signal ST that is related to the second external signal. As explained with reference to FIG. 2B, in the second operation mode, the plural data input/output terminals DQ0 to DQn and the strobe terminal DQS are connected in common by the probe 6a. However, in the present invention, because the second external signal that is supplied from a separate signal input terminal CA can be supplied as the strobe signal ST, an input timing of write data can be also controlled from outside in the test mode.

Preferred embodiments of the present invention will be explained below in detail with reference to the accompanying drawings.

Figure 3:
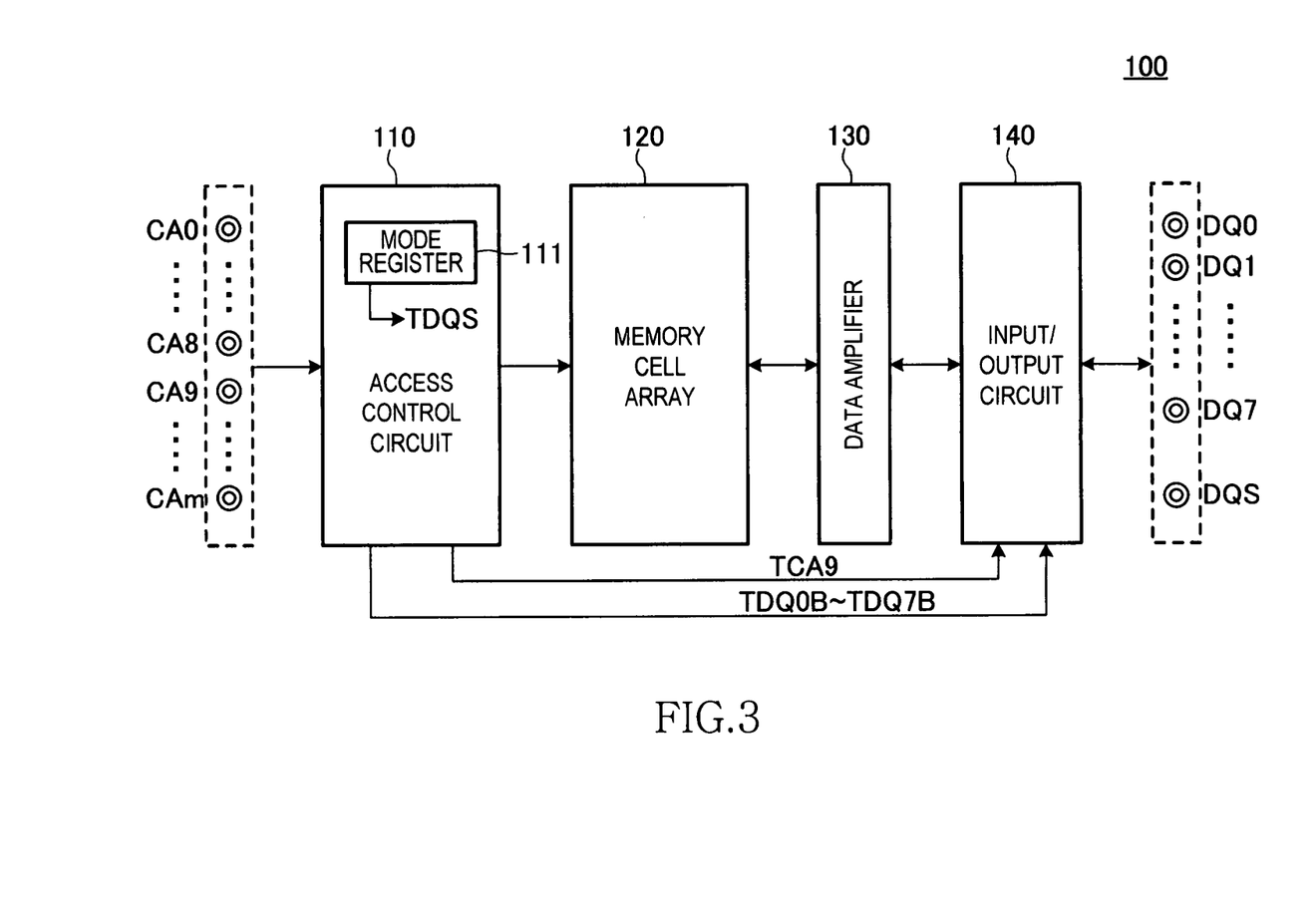
FIG. 3 is a block diagram showing a configuration of a semiconductor device 100 according to an embodiment of the present invention.

FIG. 3 is a block diagram showing a configuration of a semiconductor device 100 according to an embodiment of the present invention.

As shown in FIG. 3, the semiconductor device 100 according to the present embodiment includes plural command address terminals CA0 to CAm, plural data input/output terminals DQ0 to DQ7, and the strobe terminal DQS, as external terminals. While power source terminals or the like are provided in the semiconductor device 100, because these elements are not directly relevant to the scope of the present invention, external terminals other than those mentioned above are not shown in the drawings.

The command address terminals CA0 to CAm are signal input terminals to input a command signal and an address signal from outside. A command signal and an address signal that are supplied from outside are supplied to an access control circuit 110. The access control circuit 110 makes access to a memory cell array 120. When a supplied command signal indicates a read operation, the access control circuit 110 reads out plural pieces of read data from plural memory cells specified by a supplied address signal. The plural pieces of read data read out from the memory cell array 120 are amplified by a data amplifier 130, and are thereafter output to outside from the data input/output terminals DQ0 to DQn via an input/output circuit 140. On the other hand, when a supplied command signal indicates a write operation, the access control circuit 110 writes plural pieces of write data into plural memory cells that are assigned by a supplied address signal. The plural pieces of write data are respectively supplied from outside to the data input/output terminals DQ0 to DQn, and are supplied to the memory cell array 120 via the input/output circuit 140 and the data amplifier 130.

When the semiconductor device 100 is operating in a normal operation mode, plural pieces of read data are output in parallel from the input/output terminals DQ0 to DQn, during a read operation in this mode, and plural pieces of write data supplied in parallel to the input/output terminals DQ0 to DQn are taken into the input/output circuit 140 synchronously with a strobe signal that is supplied to the strobe terminal DQS, during a write operation. The normal operation mode corresponds to the first operation mode described above.

On the other hand, when the semiconductor device 100 is operating in the test mode, corresponding read data is output from any one of the data input/output terminals DQ0 to DQn, based on impedance control signals TDQ0B to TDQ7B that the access control circuit 110 generates, during a read operation in this mode, and one write data supplied in common to input/output terminals DQ0 to DQ7 is taken into the input/output circuit 140 synchronously with a strobe signal TCA9 that is supplied to a command address terminal CA9, during a write operation. The test mode corresponds to the second operation mode described above.

Mode selection of the semiconductor device 100 can be made by setting a mode register 111 included in the access control circuit 110. The setting of the mode register 111 is made by inputting a predetermined code from outside via the command address terminals CA0 to CAm. The mode register 111 outputs the test signal TDQS corresponding to the predetermined code.

Regarding the semiconductor device 100 according to the present embodiment, circuits related to a read operation and circuits related to a write operation are explained below in this order.

Figure 4:
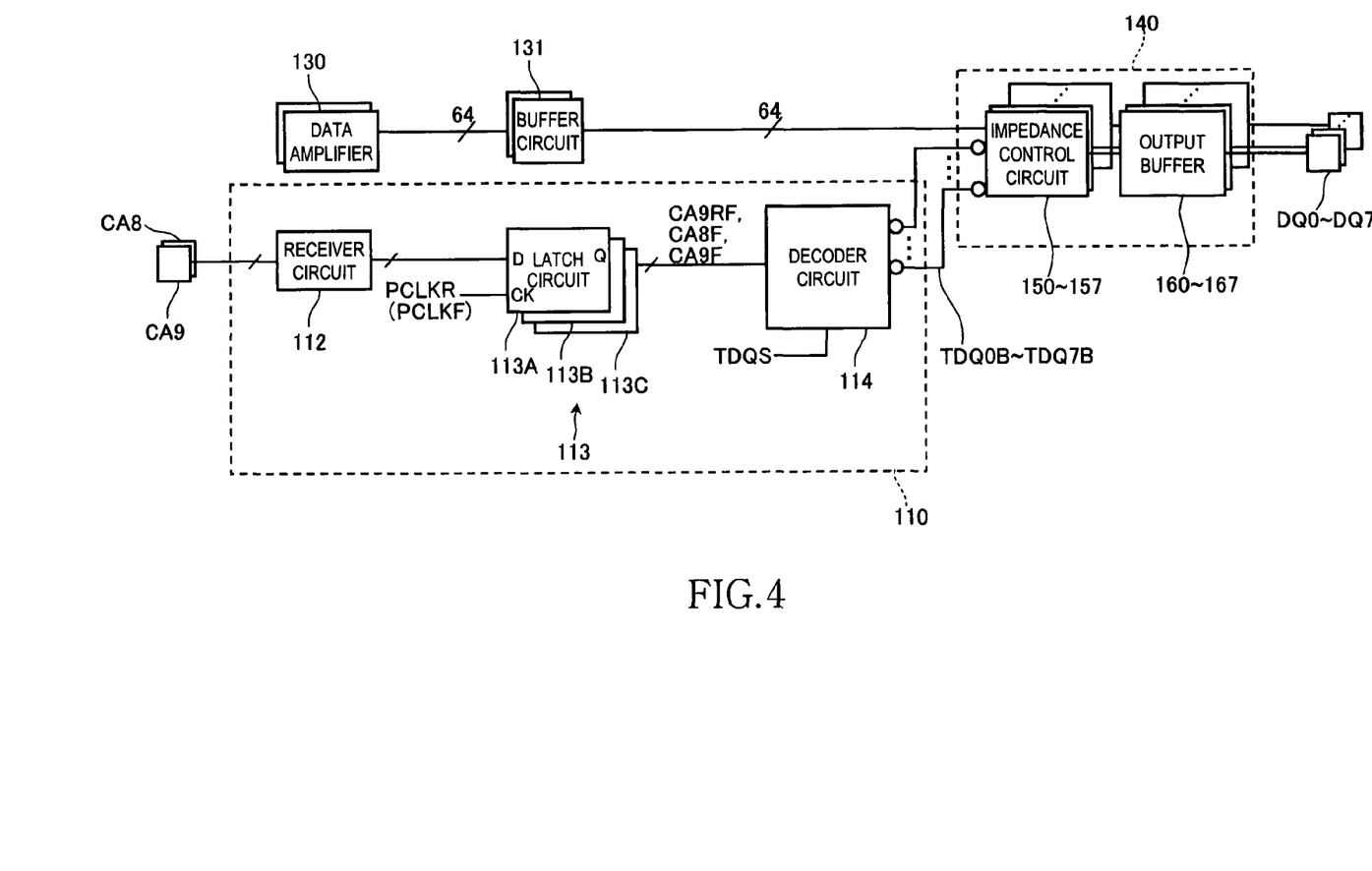
FIG. 4 is a block diagram showing a circuit related to a read operation.

FIG. 4 is a block diagram showing a circuit related to the read operation.

As shown in FIG. 4, the access control circuit 110 includes a receiver circuit 112, a latch circuit 113, and a decoder circuit 114, as a circuit block that is related to a read operation. The receiver circuit 112 is a signal input circuit that receives signals input to command address terminals CA8 and CA9, and an output of the receiver circuit 112 is supplied to the latch circuit 113. The latch circuit 113 includes three latch circuits 113a to 113c, and each of these latch circuits latches a corresponding signal synchronously with an internal clock PCLKR or PCLKF. Specifically, the latch circuit 113a latches a signal input to the command address terminal CA9 synchronously with the internal clock PCLKR, and outputs the latched signal as a signal CA9RF. The latch circuit 113b latches a signal input to the command address terminal CA8 synchronously with the internal clock PCLKF, and outputs the latched signal as a signal CA8F. The latch circuit 113c latches a signal input to the command address terminal CA9 synchronously with the internal clock PCLKF, and outputs the latched signal as a signal CA9F. The internal clock PCLKR and the internal clock PCLKF are mutually complimentary signals, and therefore their respective active edges are shifted by a ½ clock cycle. A timing when the latch circuit 113 latches a signal synchronously with the internal clock PCLKR or PCLKF is determined with predetermined latency after an active command is issued from outside to the semiconductor device 100. An output of the mode register 111 show in FIG. 3 includes an overhead bit indicating whether a test mode is a read mode or a write mode. The active command is a command for selecting and activating plural word lines included in the memory cell array 120 shown in FIG. 2. The plural word lines are selected by an address input from outside following the active command. A read command or a write command that is issued thereafter is a command for selecting plural memory cells that are related to a selected word line. As described later, in the present invention, the number of selected plural memory cells is 64 bits.

Information of three bits of signals CA9RF, CA8F, and CA9F that are generated in this way is supplied to the decoder circuit 114. The decoder circuit 114 decodes these 3-bit signals CA9RF, CA8F, and CA9F when the test signal TDQS is activated and also when the overhead bit indicates the read mode, thereby activating any one bit of 8-bit impedance control signals TDQ0B to TDQ7B. On the other hand, when the test signal TDQS is not activated, the decoder circuit 114 activates all the 8-bit impedance control signals TDQ0B to TDQ7B. The latch circuit 113 and the decoder circuit 114 correspond to the output control circuit 31 shown in FIG. 1. The test signal TDQS corresponds to an output of the mode register 111 shown in FIG. 3.

As shown in FIG. 4, the impedance control signals TDQ0B to TDQnB are supplied to the input/output circuit 140. The input/output circuit 140 includes impedance control circuits 150 to 157 and output buffers 160 to 167. The impedance control circuits 150 to 157 and the output buffers 160 to 167 output read data to the data input/output terminals DQ0 to DQ7, respectively, and correspond to the data output circuits 10 to 1n shown in FIG. 1.

The impedance control circuits 150 to 157 are activated by respectively corresponding impedance control signals TDQ0B to TDQ7B. Specifically, when the corresponding impedance control signals TDQ0B to TDQ7B are at a low level, the impedance control circuits 150 to 157 set outputs of corresponding output buffers to a low impedance state, thereby driving corresponding data input/output terminals DQ0 to DQ7 at a high level or a low level that is related to data indicated by the data amplifiers 130. On the other hand, when the corresponding impedance control signals TDQ0B to TDQ7B are at a high level, the impedance control circuits 150 to 157 set outputs of corresponding output buffers to a high impedance state, thereby setting corresponding data input/output terminals DQ0 to DQ7 to a high impedance state.

The impedance control circuits 150 to 157 are supplied with read data via buffer circuits 131 from respectively corresponding data amplifiers 130. The semiconductor device 100 according to the present embodiment is a DDR3 (Double Data Rate 3) DRAM as an example, and 8-bit read data are simultaneously output per 1DQ from the data amplifiers 130 by one read access to the memory cell array 120. In the present embodiment, because the number of data input/output terminals is eight, read data of 64 bits in total are simultaneously output from the data amplifiers 130. Therefore, in the normal operation mode, 8-bit read data are burst output from eight data input/output terminals DQ0 to DQ7, respectively, and in the test mode, corresponding 8-bit read data are burst output from any one of the eight data input/output terminals DQ0 to DQ7.

Figure 5:
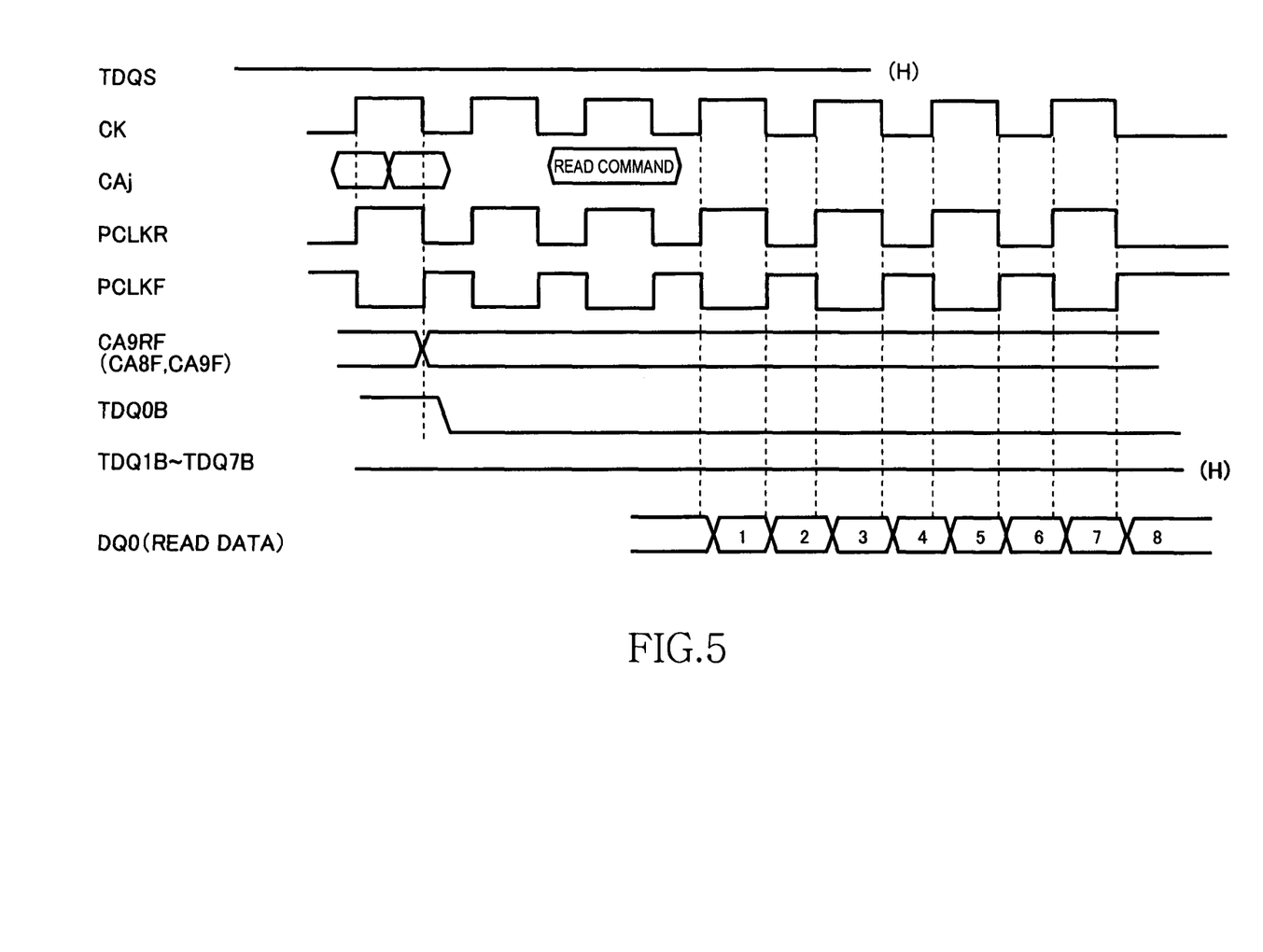
FIG. 5 is a timing diagram for explaining a read operation in the test mode.

FIG. 5 is a timing diagram for explaining a read operation in the test mode.

As shown in FIG. 5, in the test mode, the test signal TDQS is activated to a high level. In this state, an active command (not shown) is issued from outside to the semiconductor device 100. Thereafter, a selection signal is supplied to the command address terminals CA8 and CA9 with predetermined latency before a read command is issued from outside to the semiconductor device 100. As explained above, a signal supplied to the command address terminal CA8 is latched synchronously with the internal clock PCLKF, and a signal supplied to the command address terminal CA9 is latched synchronously with the internal clocks PCLKR and PCLKF. When a logic level of 3-bit binary signals CA9RF, CA8F, and CA9F is established by this operation, the decoder circuit 114 decodes the signals, thereby activating any one bit of the 8-bit impedance control signals TDQ0B to TDQ7B to a low level. In an example shown in FIG. 5, the impedance control signal TDQ0B is activated to a low level. Other impedance control signals TDQ1B to TDQ7B are all at a high level.

When a read command is issued from outside to the semiconductor device 100 and when the semiconductor device 100 is caused to perform a read operation in this state, corresponding plural pieces of read data are burst output from only the data input/output terminal DQ0, and other data input/output terminals DQ1 to DQ7 become in a high impedance state.

In the test mode, as explained with reference to FIG. 2B, plural data input/output terminals are electrically connected in common by the same probe 6a outside the semiconductor device. Therefore, when individual read data are output from the data input/output terminals DQ0 to DQ7, data collision occurs. However, in the present embodiment, in the test mode, only any one of the data input/output terminals DQ0 to DQ7 is used and remaining all data input/output terminals are set to a high impedance state. Therefore, read data can be output to the probe 6a without generating data collision.

Further, the read data output to the probe 6a are not compressed data obtained as a result of a compression test but are actual data themselves output via the output buffers 160 to 167 and the data input/output terminals DQ0 to DQ7 from the data amplifiers 130. Therefore, non-compressed actual data can be directly monitored from outside the semiconductor device 100. By performing this series of operations, that is, by changing information of a selection signal related to the command address terminals CA8 and CA9 before a read command is issued and by supplying the changed information to the semiconductor device 100, and by issuing the read command, non-compressed actual data related to each of the data input/output terminals DQ0 to DQ7 can be directly monitored from outside the semiconductor device 100.

Figure 6:
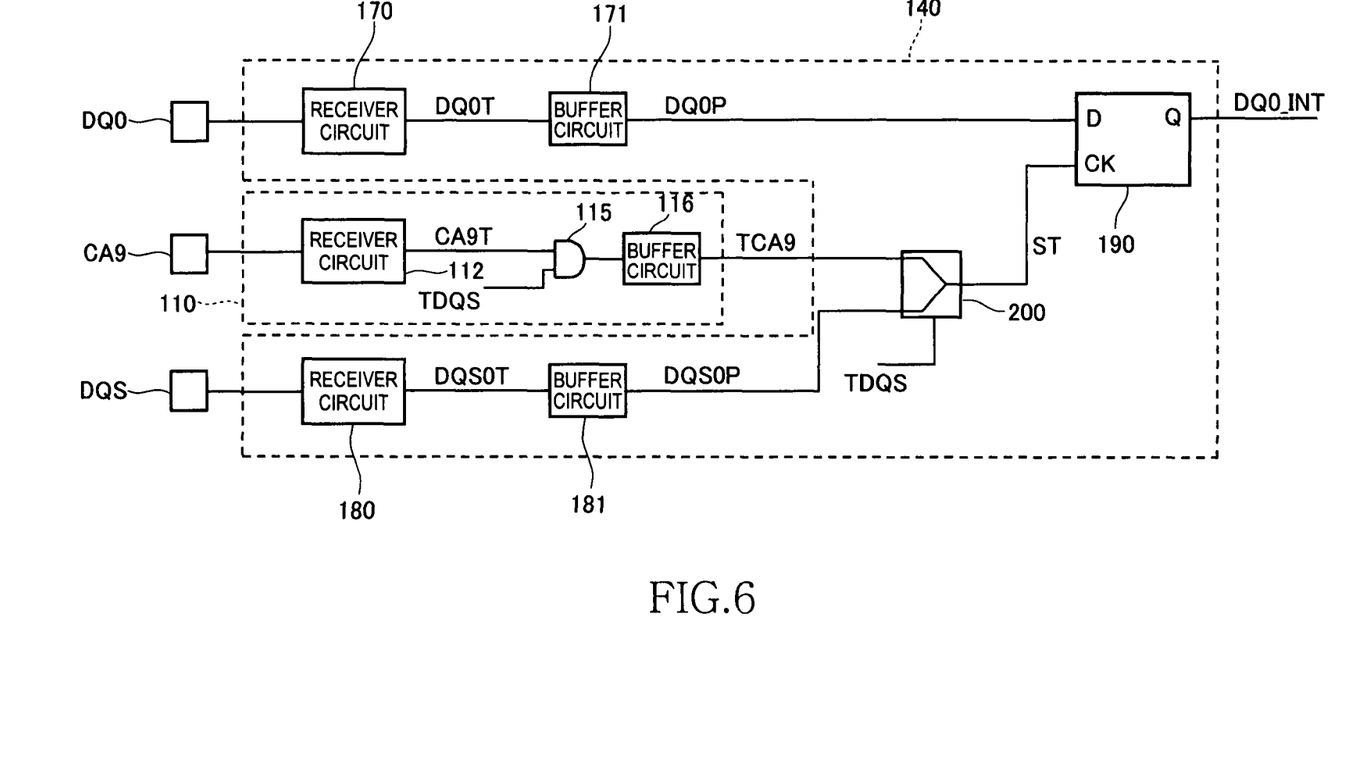
FIG. 6 is a block diagram showing a circuit related to a write operation.

FIG. 6 is a block diagram showing a circuit related to the write operation.

As shown in FIG. 6, the access control circuit 110 includes the receiver circuit 112 and an AND gate circuit 115 as a circuit block that is related to a write operation. The receiver circuit 112 receives a signal supplied to the command address terminal CA9, and an output of this circuit is supplied to one input node of the AND gate circuit 115. The test signal TDQS is supplied to the other input node of the AND gate circuit 115. Accordingly, when the test signal TDQS is activated to a high level and also when an overhead bit indicates the write mode, a signal supplied to the command address terminal CA9 is output as the strobe signal TCA9 via a buffer circuit 116. Transition of logic of the strobe signal TCA9 is linked to transition of logic of a signal supplied to the command address terminal CA9, during a period of a write operation in the test mode. On the other hand, when the test signal TDQS is inactivated to a low level, the strobe signal TCA9 always becomes at a low level.

As shown in FIG. 6, the strobe signal TCA9 is supplied to the input/output circuit 140. The input/output circuit 140 includes receiver circuits 170 and 180 and a data latch circuit 190. The receiver circuit 170 is connected to the data input/output terminal DQ0. Although similar receiver circuits are also connected to other data input/output terminals DQ1 to DQ7, respectively, FIG. 6 shows only the receiver circuit 170 that is connected to the data input/output terminal DQ0. The receiver circuit 180 is connected to the strobe terminal DQS, and constitutes a DQS circuit in the present invention. One DQS circuit is related to at least the plural data input/output terminals DQ0 to DQ7. Write data DQ0T as an output of the receiver circuit 170 is supplied to a buffer circuit 171, and write data DQ0P as an output of the buffer circuit 171 is supplied to an input node D of the data latch circuit 190.

The data latch circuit 190 latches the write data DQ0P that is supplied to the input node D, synchronously with a clock node CK. The receiver circuit 170 and the data latch circuit 190 correspond to the data input circuit 20 shown in FIG. 1. The strobe signal ST is supplied to the clock node CK of the data latch circuit 190. Therefore, the write data DQ0P is latched synchronously with the strobe signal ST.

The strobe signal ST is supplied from a selection circuit 200. The selection circuit 200 outputs one of the strobe signal TCA9 and the strobe signal DQS0P, and this selection is determined based on the test signal TDQS. Specifically, when the test signal TDQS is activated to a high level, the strobe signal TCA9 is selected, and when the test signal TDQS is inactivated to a low level, the strobe signal DQS0P is selected.

The strobe signal DQS0P is supplied to the strobe terminal DQS from outside, and is a signal obtained after the strobe signal DQS0T received by the receiver circuit 180 is buffered by a buffer circuit 181. Therefore, in the normal operation mode, write data is taken into the data latch circuit 190 synchronously with a strobe signal supplied to the strobe terminal DQS, and in the test mode, write data is taken into the data latch circuit 190 synchronously with a strobe signal supplied to the command address terminal CA9. Write data DQ0_INT that is taken into the data latch circuit 190 is supplied to the data amplifier 130 shown in FIG. 3.

Figure 7:
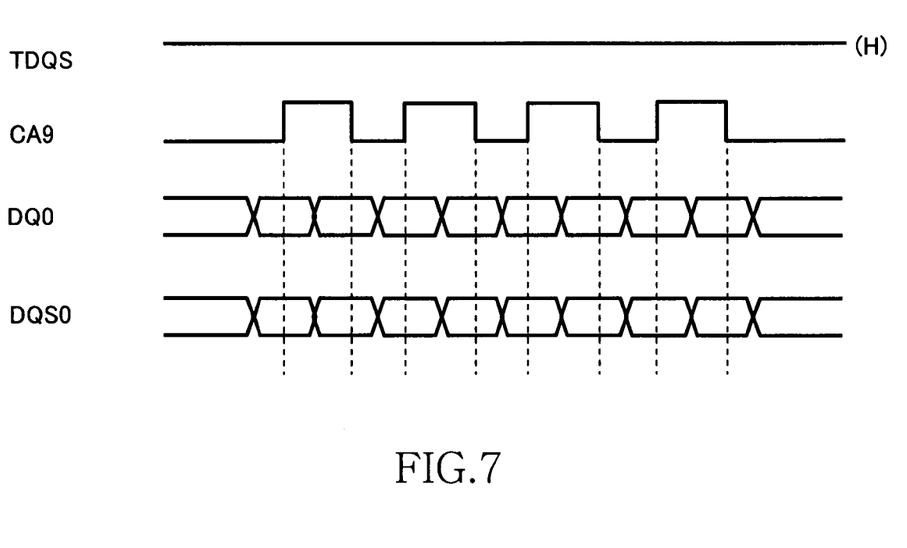
FIG. 7 is a timing diagram for explaining a write operation at a time of a test mode.

FIG. 7 is a timing diagram for explaining a write operation at the time of the test mode.

As shown in FIG. 7, in the test mode, the test signal TDQS is activated to a high level. When a signal to be transmitted to the command address terminal CA9 is clocked in this state, the clocked signal is supplied to the clock node CK of the data latch circuit 190 shown in FIG. 6. That is, the signal to be supplied to the command address terminal CA9 becomes a strobe signal for taking in write data supplied from outside in the test mode.

In the test mode, as explained with reference to FIG. 2B, the plural data input/output terminals and the strobe terminal are electrically connected in common by the probe 6a outside the semiconductor device. Accordingly, as shown in FIG. 7, write data is also supplied to the strobe terminal DQS that should take in the write data, and a strobe signal for taking in write data cannot be input from the strobe terminal DQS. However, in the present embodiment, in the test mode, a strobe signal for taking in write data can be supplied from the command address terminal CA9 as a separate external terminal that is related to the probe 6b that is different from the probe 6a. Therefore, the strobe signal can be correctly supplied to the clock node C of the data latch circuit 190.

Further, write data supplied to plural memory cells respectively corresponding to the data input/output terminals DQ0 to DQ7, which are included in the memory cell array 120, are not compressed data supplied from only a specific data input/output terminal, but are actual data themselves supplied from all the data input/output terminals DQ0 to DQ7 via respectively corresponding input/output terminals 140 (specifically, each of the receiver circuits 170 and each of the data latch circuits 190). Therefore, non-compressed actual data can be supplied to the memory cell array 120 included in the semiconductor device 100.

Figure 8:
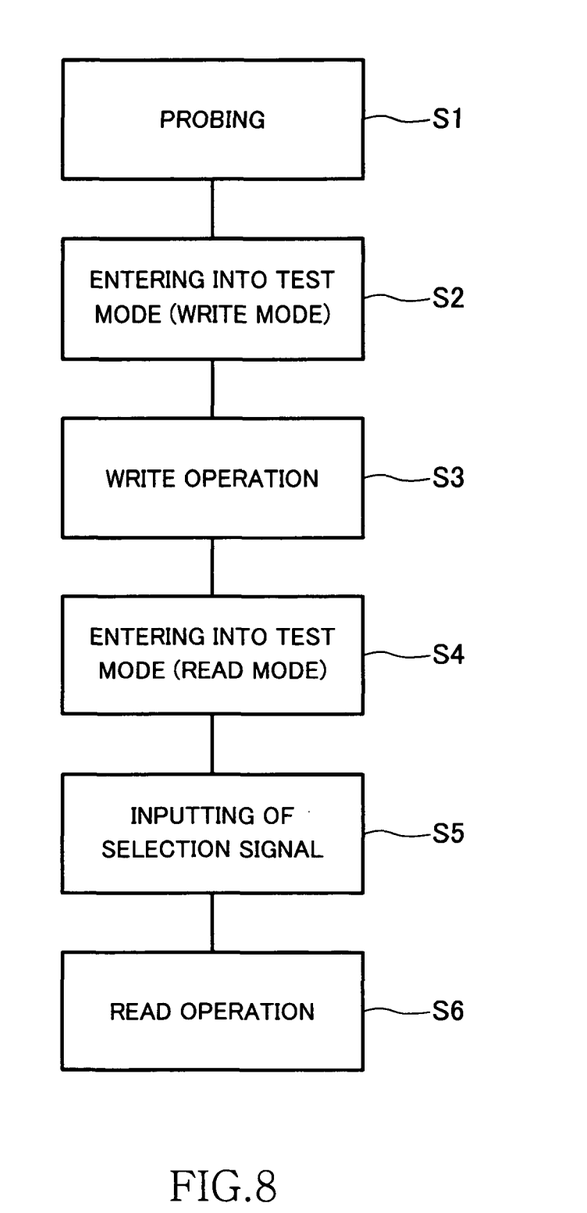
FIG. 8 is a flowchart for explaining a flow of an operation test of a semiconductor device that uses a tester.

FIG. 8 is a flowchart for explaining a flow of an operation test of a semiconductor device that uses a tester.

In the operation test, first, plural first test probes that are mutually electrically connected in common are connected to the data input/output terminals DQ0 to DQ7 and the strobe terminal DQS, respectively, and a second test probe is connected to the command address terminals CA0 to CAm (Step S1). The first test probe corresponds to the probe 6a shown in FIG. 2B, and the second test probe corresponds to the probe 6b shown in FIG. 2B.

Next, setting of the mode, register 111 is made via the second test probe, and the mode register 111 enters into the test mode and the write mode (Step S2).

Next, write data are input to the data input/output terminals DQ0 to DQ7 via the first test probe, and also a strobe signal is input to the command address terminal CA9 via the second test probe (Step S3). Accordingly, one write data that is common to the data input/output terminals DQ0 to DQ7 is taken into the data latch circuits 190 that are respectively connected to the data input/output terminals DQ0 to DQ7, synchronously with the strobe signal. The common write data taken into the plural data latch circuits 190 is respectively written into plural memory cells, which are assigned by an address signal within the memory cell array 120. This operation is as explained with reference to FIGS. 6 and 7. An active command (not shown) is supplied between Steps S2 and S3. When writing write data into all column addresses that are related to one word line (row address), Step 3 is repeated. Further, when writing write data into plural word lines included in the memory cell array 120, a set of an active command (not shown) and Step 3 is repeated at plural set times. A known precharge command is not shown in the drawings.

Next, setting of the mode register 111 is made via the second test probe, and the mode register 111 enters into the test mode and the read mode (Step S4). Thereafter, a selection signal is input to the command address terminals CA8 and CA9 via the second test probe to activate one of the impedance control signals TDQ0B to TDQ7B, thereby selecting one of the impedance control circuits 150 to 157 (Step S5). When a read command is issued in this state, corresponding read data is output from one of the data input/output terminals DQ0 to DQ7, and is supplied to a tester via the first test probe (Step S6). When reading read data from all the data input/output terminals DQ0 to DQ7, a set of Step S5 for changing a selection signal and Step S6 is repeated at plural set times.

This operation is as explained with reference to FIGS. 4 and 5. An active command (not shown) is supplied between Steps S4 and S5. When reading read data from all column addresses that are related to one word line (row address), Steps S5 and S6 at plural set times are repeated at plural group times. Further, when reading read data from plural word lines included in the memory cell array 120, an active command (not shown) and Steps S5 and S6 at plural set times are repeated at plural times. A known precharge command is not shown in the drawings.

Steps S5 and S6 described above are performed on all the data input/output terminals DQ0 to DQ7 by switching the impedance control signals TDQ0B to TDQ7B. That is, read data are sequentially output from the data input/output terminals DQ0 to DQ7, by repeating eight times a read operation by assigning the same address, and by activating the impedance control signals TDQ0B to TDQ7B that are different from each other. Accordingly, actual data (64 bit) themselves that are output from the data amplifiers 130, and not compressed data, can be monitored.

Although not particularly limited, it is preferable that each step described above is performed in a wafer state before plural semiconductor devices are cut out. In an operation test performed in a wafer state, it is important to test many chips in parallel. For this purpose, plural data input/output terminals are connected in common is some cases as shown in FIG. 2B. Even in this state, when it is necessary to monitor actual data, instead of compressed data, application of the present invention is suitable.

Figure 9:
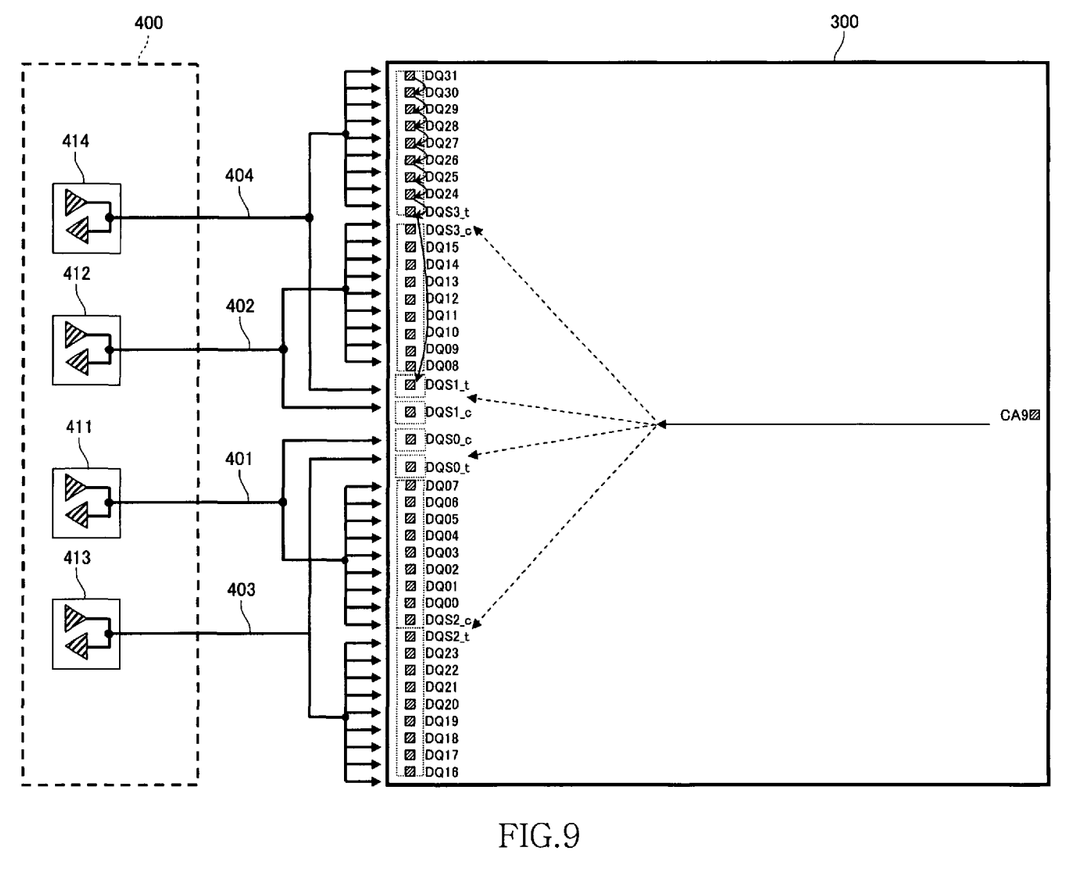
FIG. 9 is a schematic diagram showing a connection relation between a semiconductor device 300 and a tester 400 according to a modification.

FIG. 9 is a schematic diagram showing a connection relation between a semiconductor device 300 and a tester 400 according to a modification.

In an example shown in FIG. 9, the semiconductor device 300 includes 32 data input/output terminals DQ00 to DQ31, eight strobe terminals DQS0_c to DQS3_c and DQS0_t to DQS3_t. The 32 data input/output terminals DQ00 to DQ31 are divided into four groups. A first group DQ00 to DQ07 is allocated to strobe terminals DQS0_c and DQS2_c, a second group DQ08 to DQ15 is allocated to strobe terminals DQS1_c and DQS3_c, a third group DQ16 to DQ23 is allocated to strobe terminals DQS0_t and DQS2_t, and a fourth group DQ24 to DQ31 is allocated to strobe terminals DQS1_t and DQS3_t. Two strobe terminals that form a pair are supplied with complementary strobe signals.

As for the semiconductor device 300 having a structure as described above, four probes 401 to 404 corresponding to the probe 6a shown in FIG. 2B are used. As shown in FIG. 9, the probe 401 is connected in common to eight data input/output terminals that belong to the first group and two strobe terminals. The probe 402 is connected in common to eight data input/output terminals that belong to the second group and two strobe terminals. The probe 403 is connected in common to eight data input/output terminals that belong to the third group and two strobe terminals. The probe 404 is connected in common to eight data input/output terminals that belong to the fourth group and two strobe terminals. The probes 401 to 404 are connected to mutually different input/output circuits 411 to 414 within the tester 400.

When performing a write operation (Step S3 in FIG. 8) in the test mode, write data are respectively supplied from the probes 401 to 404, and a strobe signal is supplied from the command address terminal CA9 by using a separate probe (not shown). A strobe signal generated from a signal supplied to the semiconductor device 300 via the command address terminal CA9 is transformed into complementary signals within the semiconductor device 300, and substitutes a pair of original strobe signals that is supplied in the normal operation mode.

When performing a read operation (Steps S4 and S5 in FIG. 8) in the test mode, each one data input/output terminal to be set to low impedance is selected for each group, and a read command is issued in this state. Accordingly, read data are output to the probes 401 to 404 from respectively selected data input/output terminals, and are supplied to the tester 400. When this operation is repeatedly performed by switching data input/output terminals to be set to low impedance, all write data can be taken into the tester 400 in a state of actual data.

As explained above, the number of probes to be connected in common to data input/output terminals of a semiconductor device does not need to be one, and it also suffices that the probe is provided for each group like in the example shown in FIG. 9.

It is apparent that the present invention is not limited to the above embodiments, but may be modified and changed without departing from the scope and spirit of the invention.

For example, the mode register 111 shown in FIG. 3 can output a test signal TDQSR indicating that the test mode is a read mode and a test signal TDQSW indicating that the test mode is a write mode. The test signal TDQSR is supplied to the decoder circuit 114 shown in FIG. 4. The test signal TDQSW is supplied to the AND gate circuit 115 and the selection circuit 200 shown in FIG. 6.

Mode selection of the semiconductor device 100 can be made by performing setting of the mode register 111 included in the access control circuit 110. Setting of the mode register 111 is made such that the test signal TDQSR is set by inputting a first code from outside via the command address terminals CA0 to CAm, and the test signal TDQSW is set by inputting a second code from outside.

The technical concept of the present application is not limited to a semiconductor device as a memory and a test function thereof, and can be also applicable to a semiconductor device having a large number of data terminals and a test function thereof, for example. In addition, the circuit format within each of the circuit blocks disclosed by the drawings and a circuit that generates other control signals are not limited to those disclosed in the above embodiment.

The basic technical concept of a semiconductor device according to the present invention can be applied not only to an exclusive storage device, but to various types of semiconductor devices. For example, the present invention can be applied to semiconductor devices in general, such as a CPU (Central Processing Unit), an MCU (Micro Control Unit), a DSP (Digital Signal Processor), an ASIC (Application Specific Integrated Circuit), or an ASSP (Application Specific Standard Product), which has an information storage function. For example, an SOC (System on Chip), an MCP (Multi Chip Package), and a POP (Package on Package) can be mentioned as product formats of such a semiconductor device to which the present invention is applied. The present invention is applicable to semiconductor devices with the above arbitrary product format or package format.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

It is apparent that the present invention is not limited to the above embodiments, but may be modified and changed without departing from the scope and spirit of the invention.

What is claimed is:

1. A semiconductor device comprising:
a plurality of data input/output terminals each of which is used to output read data to outside and input write data from outside;
a plurality of data output circuits each of which outputs the read data to an associated one of the data input/output terminals;
a plurality of data input circuits each of which takes in the write data supplied from an associated one of the data input/output terminals synchronously with a strobe signal;
a strobe terminal to which the strobe signal is supplied from outside;
a signal input terminal to which a signal is supplied from outside, the signal input terminal being different from the data input/output terminals, the strobe terminal, and a terminal that controls the data input/output terminals; and
a control circuit having a first operation mode and a second operation mode, wherein
in the first operation mode, the control circuit activates all the data output circuits to output the read data in parallel to the data input/output terminals or the control circuit activates all the data input circuits to take in the write data supplied in parallel from the data input/output terminals synchronously with the strobe signal, and
in the second operation mode, the control circuit selectively activates one of the data output circuits based on the signal supplied to the signal input terminal to output the read data to an associated one of the data input/output terminals and inactivates the other of the data output circuits, or the control circuit activates all the data input circuits to take in the write data supplied in parallel from the data input/output terminals synchronously with the signal supplied to the signal input terminal instead of the strobe signal.

2. The semiconductor device as claimed in claim 1, wherein
the control circuit includes a selection circuit that selects one of an output signal of a DQS circuit that is connected to the strobe terminal and an output signal of a signal input circuit that is connected to the signal input terminal, the control circuit supplying a selected one of the output signals to the data input circuits, and
the selection circuit selects the output signal of the DQS circuit in the first operation mode, and selects the output signal of the signal input circuit in the second operation mode.

3. The semiconductor device as claimed in claim 1, wherein
the control circuit includes a decoder that decodes a binary signal supplied via a signal input circuit that is connected to the signal input terminal, and
the control circuit selects one of the data output circuits based on an output signal of the decoder in the second operation mode.

4. The semiconductor device as claimed in claim 1, wherein, in the second operation mode, the control circuit controls an output node of selected one of the data output circuits to a low impedance state based on the signal supplied to the signal input terminal, and controls output nodes of the other of the data output circuits to a high impedance state.

5. The semiconductor device as claimed in claim 1, wherein, the control circuit controls output nodes of all the data output circuits to a low impedance state in the first operation mode.

6. The semiconductor device as claimed in claim 1, wherein, the signal input terminal is supplied with an address signal or a command signal in the first operation mode.

7. The semiconductor device as claimed in claim 1, wherein, the data input/output terminals and the strobe terminal are electrically connected in common via a test probe of outside in the second operation mode.

8. A test method of a semiconductor device using a tester, the method comprising:
electrically connecting a plurality of first test probes of the tester that are electrically connected in common, respectively to a plurality of data input/output terminals and a strobe terminal of the semiconductor device, the strobe terminal inputting and outputting a strobe signal for defining output timing of read data from the data input/output terminals and defining input timing of write data into the data input/output terminals;
electrically connecting at least one second test probe of the tester to at least one signal input terminal of the semiconductor device that is not related to control of the data input/output terminals;
supplying at least one signal to the at least one signal input terminal via the at least one second test probe;
selectively outputting the read data from one of the data input/output terminals based on the at least one signal and not outputting the read data from remaining ones of the data input/output terminals in a test mode and in a read mode;
taking in the write data that is supplied in common to the data input/output terminals, synchronously with the at least one signal without using the strobe terminal in the test mode and in the write mode;
receiving the read data from the first test probes in the read mode; and
supplying the write data in common to the data input/output terminals in the write mode.

9. The test method as claimed in claim 8, wherein, in the test mode and in the read mode,
the semiconductor device selects one of a plurality of data output circuits each connected to an associated one of the data input/output terminals based on the at least one signal and does not select remaining ones of the data output circuit, and
the semiconductor device outputs the read data from selected one of the data output circuits to the tester, via an associated one of the data input/output terminals and via an associated one of the first test probes.

10. The test method as claimed in claim 8, wherein, in the test mode and in the write mode, the semiconductor device takes the write data into a plurality of data input circuits each connected to an associated one of the data input/output terminals synchronously with the at least one signal.

11. The test method as claimed in claim 8, wherein
the tester brings the semiconductor device into the test mode via another test probe,
the tester issues a read command to bring the semiconductor device into the read mode, and
the tester issues a write command to bring the semiconductor device into the write mode.

12. A test method of a semiconductor device using a tester, the method comprising:
electrically connecting a plurality of first test probes of the tester that are electrically connected in common, respectively to a plurality of data input/output terminals of the semiconductor device;

electrically connecting at least one second test probe of the tester to at least one signal input terminal of the semiconductor device that is not related to control of the data input/output terminals;

supplying at least one selection signal to the at least one signal input terminal via the at least one second test probe;

selecting one of a plurality of data output circuits each connected to an associated one of the data input/output terminals based on the at least one selection signal so as to be able to output read data therefrom, and not selecting remaining ones of the data output circuits; and receiving the read data output from selected one of the data output circuits via an associated one of the data input/output terminals and via an associated one of the first test probes.

13. The test method as claimed in claim 12, further comprising:

electrically connecting one of the first test probes to a strobe terminal of the semiconductor device, the strobe terminal inputting and outputting a strobe signal for defining output timing of the read data from the data input/output terminals and defining input timing of write data into the data input/output terminals;

supplying the write data in common to the data input/output terminals via the first test probes;

supplying a test strobe signal to the at least one signal input terminal via the at least one second test probe; and taking the write data that is supplied in common to the data input/output terminals into a plurality of data input circuits each connected to an associated one of the data input/output terminals, synchronously with the test strobe signal.

14. The test method as claimed in claim 12, wherein the test method is carried out on a wafer state on which a plurality of the semiconductor devices are formed.

15. The test method as claimed in claim 14, wherein the test method is carried out in parallel to more than one semiconductor device of the plurality of the semiconductor devices.

16. The semiconductor device as claimed in claim 2, wherein
the control circuit includes a decoder that decodes a binary signal supplied via a signal input circuit that is connected to the signal input terminal, and
the control circuit selects one of the data output circuits based on an output signal of the decoder in the second operation mode.

17. The semiconductor device as claimed in claim 2, wherein, in the second operation mode, the control circuit controls an output node of selected one of the data output circuits to a low impedance state based on the signal supplied to the signal input terminal, and controls output nodes of the other of the data output circuits to a high impedance state.

18. The semiconductor device as claimed in claim 17, wherein, the signal input terminal is supplied with an address signal or a command signal in the first operation mode.

19. The semiconductor device as claimed in claim 2, wherein, the signal input terminal is supplied with an address signal or a command signal in the first operation mode.

* * * * *